United States Patent [19]

Salice

[11] Patent Number: 5,378,090
[45] Date of Patent: Jan. 3, 1995

[54] ADAPTER FOR DRILLING MACHINES

[75] Inventor: Luciano Salice, Carimate, Italy

[73] Assignee: Arturo Salice S.p.A., Novedrate, Italy

[21] Appl. No.: 147,534

[22] Filed: Nov. 5, 1993

[30] Foreign Application Priority Data

Nov. 6, 1992 [DE] Germany ............................ 4237560

[51] Int. Cl.⁶ .............................................. B23B 47/30
[52] U.S. Cl. .......................................... 408/42; 408/53
[58] Field of Search ........................ 408/42, 46, 47, 53

[56] References Cited

U.S. PATENT DOCUMENTS

| | | | |
|---|---|---|---|
| 2,879,675 | 3/1959 | Morris | 408/53 |
| 3,203,282 | 8/1965 | Wilson | 408/46 |
| 4,609,310 | 9/1986 | Blum | 408/53 |

FOREIGN PATENT DOCUMENTS

| | | | |
|---|---|---|---|
| 642926 | 9/1928 | France | 408/53 |
| 909630 | 3/1954 | Germany | 408/53 |
| 2125483 | 12/1972 | Germany . | |
| 2511724 | 10/1976 | Germany . | |
| 3508521 | 10/1985 | Germany . | |

*Primary Examiner*—Daniel W. Howell
*Attorney, Agent, or Firm*—Jacobson, Price, Holman & Stern

[57] ABSTRACT

To retool drilling machines having at least two drill spindles with coupling members for drill bits with a different pattern of drilled holes, an adapter is provided including a housing with two mutually parallel input shafts whose distance apart corresponds to the distance between the two drill spindles and whose form is the same as drill bits to be inserted into the two drill spindles. On the opposite housing side, two drill spindles or groups of drill spindles to be connected together by transmission means are arranged which have chuck members for drill bits, of which each or each group is connected in a driving manner with one of the two input shafts.

5 Claims, 2 Drawing Sheets

ADAPTER FOR DRILLING MACHINES

FIELD OF THE INVENTION

The invention relates to an adapter for drilling machines comprising at least two drill spindles with attachment devices for drill bits.

BACKGROUND OF THE INVENTION

Drilling machines with a plurality of drill spindles are for instance employed for simultaneously drilling a plurality of holes in similar workpieces, as is more particularly the case in serial production. Such a drilling machine, which may be employed for drilling attachment holes for mounting furniture hinges, is also provided with an assembling means for pressing in pot-shaped hinge parts in the drilled or routed receiving or plug holes and is disclosed in German patent publication 3,508,521 A.

Conventional drilling machines are provided with one drill spindle carrier for a plurality of drill spindles, it being possible to arrange different spindle carriers on the transmission block of the drilling machine for drilling holes in different patterns. These replaceable spindle carriers are however merely suitable for mounting on a drilling machine of one given type and they are not suitable for mounting on drilling machines of a different make even if such machines are to be employed for drilling holes in the same pattern.

SUMMARY OF THE INVENTION

Consequently one object of the invention is to provide a universal drill spindle carrier for drilling machines, which is simple and rapid to mount on drilling machines of different makes and hence renders it possible to retool drilling machines of different types for different hole patterns.

In accordance with the invention, this object is to be achieved with an adapter of the type initially mentioned, which comprises a housing with two mutually parallel input shafts, whose distance apart is the same as the distance between the two drill spindles and the configuration thereof corresponds to the shanks of the drill bits to be secured therein, the housing having two drill spindles or groups of drill spindles arranged on the opposite housing side connected together by transmission means, with attachment means for drill bits, of which each or each group is connected with one of the two input shafts in a driving manner.

The adapter in accordance with the invention generally renders a complex retooling of the drilling machine unnecessary because the drill spindle carrier connected with the transmission is replaced by another carrier with a different arrangement of the drill spindles. The adapter in accordance with the invention is simply, like conventional drills, connected with two drill spindles of the drilling machine to be retooled without mechanical retooling modification of the drilling machine itself being necessary.

Since the receiving sockets or attachment means of the drill spindle are basically the same in all types of drill spindles, the adapter in accordance with the invention will suit drilling machines of different types. It is more particularly in the case of industrial production of modern furniture that a so-called "system distance" has become generally accepted, in the case of the mounting holes for furniture fittings such as furniture hinges having a spacing of 32 mm. It is for this standard pitch that drilling machines as well are designed for the mounting of furniture fittings so that the input shafts of the adapter in accordance with the invention have this standard drill spindle spacing. Naturally it is also possible to select another standardized distance.

The input shafts of the adapter housing are coupled in the customary fashion with the drill spindles of the drilling machine to be retooled. On the output side of the adapter housing the drill spindles are then arranged in a pattern which corresponds to the pattern of holes to be bored. In this case the individual drill spindles or group of drill spindles on the output side of the adapter are respectively driven by the drill spindle of the drilling machine.

The adapter may furthermore be so contrived that all input side drill spindles are driven by only one input shaft. In this case the second input shaft coupled with a drill spindle of the drilling machine will merely serve to hold and steady the adapter.

It is convenient to provide four drill spindles on the output side, of which two spindles have the normal distance apart of the input shaft. These two drill spindles then render it possible to drill holes with the standardized distance apart.

In accordance with a further advantageous development of the invention at least one of the two input shafts on the input side bears a coupling device for one drill bit and is provided with a pinion, which is in mesh with two gear wheels on two drive spindle shafts bearing on the side of this input shaft. With this arrangement of the drill spindles it is possible to drill modified patterns of holes.

It is convenient furthermore if the lateral drill spindles are arranged symmetrically in relation to the plane extending through the center lines of the two input shafts.

In the case of one possible pattern of holes, the central drill spindle provided with the driving pinion mounts a large drill bit as for instance a router-type drill bit for cutting holes for hinge pots. With such an adapter it is then possible to produce the recesses or holes for hinge pots in doors or flaps in a single working operation and simultaneously to drill all mounting plug receiving holes for the attachment of the hinge pot.

It is furthermore convenient if the driving pinion has a larger diameter than the diameter of the gear wheels of the lateral drill spindles.

It is naturally possible for the drilling machines fitted with the adapter in accordance with the invention to have a conventional assembly device for pressing home furniture fittings into the drilled holes, which for instance consists of a yoke-like lever.

One embodiment of the invention will now be described with reference to the drawings.

DETAILED DESCRIPTION OF THE DRAWINGS

Figure 1:
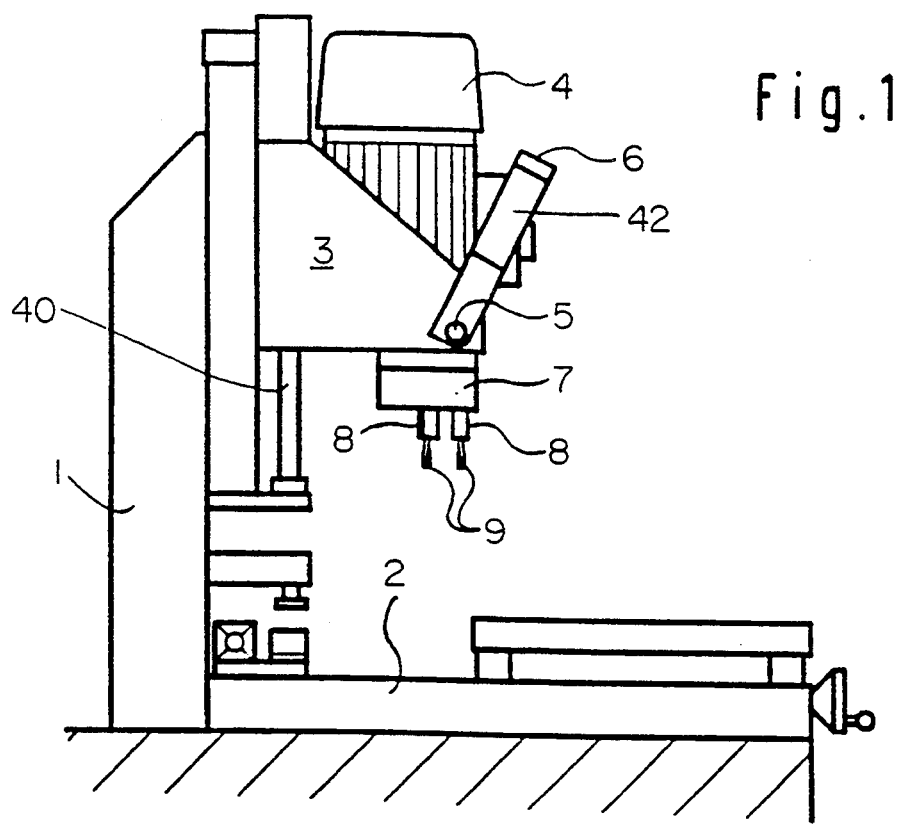
FIG. 1 shows a conventional drilling and assembly machine for drilling attachment holes for furniture fittings and for the insertion of such furniture fittings, in a diagrammatical side elevation.

FIG. 1 diagrammatically shows a side elevation of a customary drilling and inserting machine for furniture fittings. In the machine frame 1, which is provided with a workpiece carrier 2 and carrying and guiding columns (not illustrated in detail) for the drilling system, a support 40, which is connected with a slidingly mounted transmission block 3, also bears the drive motor 4. On lateral trunnions of the transmission block 3 a yoke-like lever 42 is pivoted and it bears a pressing punch 6 with which furniture fittings can be inserted and driven home in receiving recesses.

The transmission block 3 is provided with a drill spindle carrier 7, which is circular in cross section in plan view and which has two drill spindles 8 driven via pinions and which are drivingly connected via customary drive means with the output shaft of the drive motor 4. The drill spindles 8 are furnished with conventional coupling members in order to receive drill bits 9.

Furthermore the drilling machine is fitted with a customary means, for instance in the form of a hand lever, for lowering the drill spindle carrier onto the workpiece to be drilled or to be otherwise processed.

Figure 2:
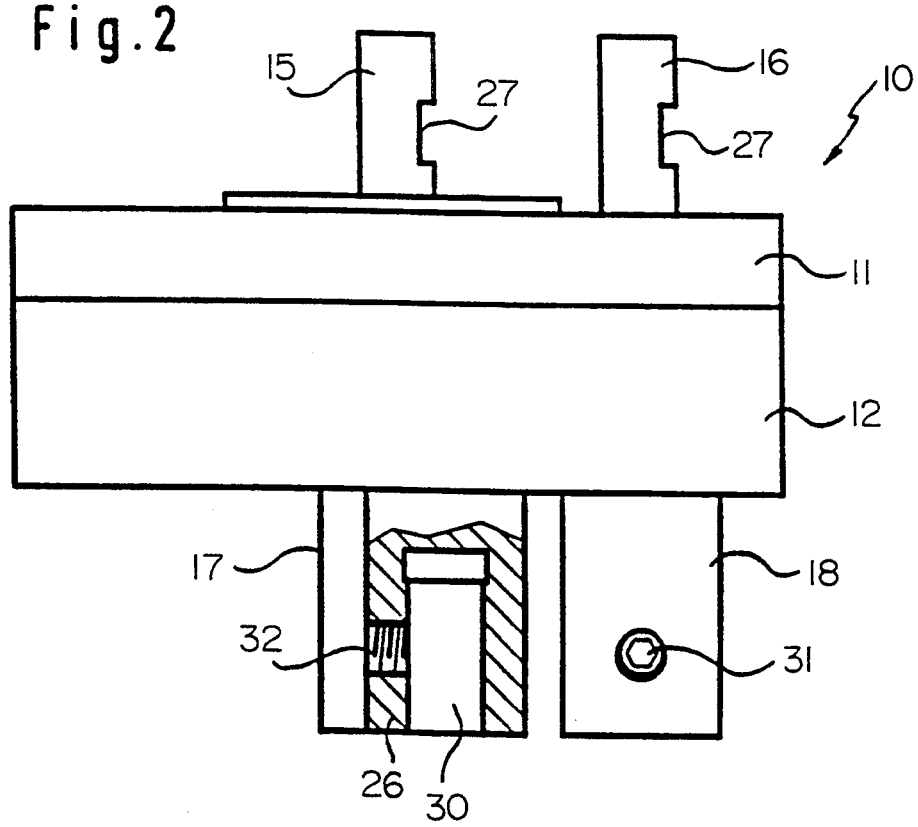
FIG. 2 is a lateral elevation of the adapter for retooling the drilling machine as depicted in FIG. 1 on a drill spindle arrangement adapted to a different hole pattern.
Figure 3:
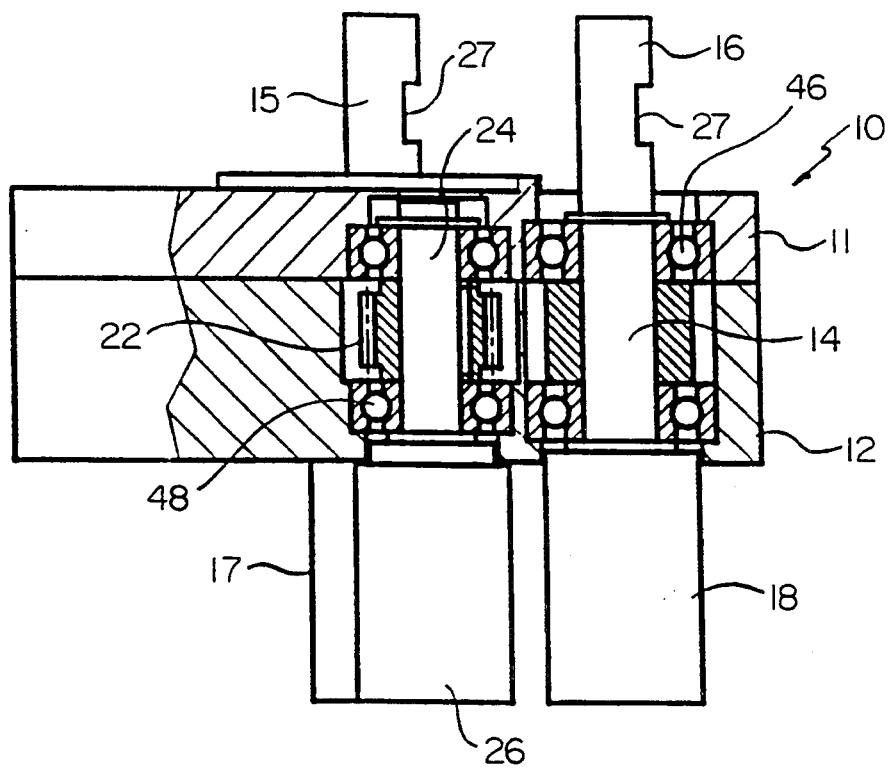
FIG. 3 is an elevation corresponding to FIG. 2 with the housing of the adapter partly broken away.

In the FIGS. 2 and 3 the drill spindle carrier 10 constituting the adapter in accordance with the invention will be seen in a lateral and partly sectioned elevation. In this respect the section is taken on the line III—III in FIG. 4.

The drill spindle carrier 10 consists of an adapter housing 44 with a lower housing part 12 and a cover 11 mounted on it. In the housing 10 two shafts 13 and 14 are carried for rotation and their journals 15 and 16 extend past the housing cover 11. The shafts 13 and 14 have the same standardized distance apart as the drill spindles 8 of the drilling machine depicted in FIG. 1, that is to say for instance 32 mm. On the opposite housing side from the shafts 13 and 14 are drill spindles 17 and 18 provided with coupling or attachment members in order to mount drill bits.

The shafts 13 and 14 are carried in the fashion apparent to the left in FIG. 3 by means of ball bearings 46 in the housing 10.

On the shaft 13 a pinion 20 is keyed in the housing 10 and it is in mesh with gear wheels 21 and 22, which are secured to drill spindle shafts 23 and 24 journaled in the housing 10. The shafts 23 and 24 are journaled in the fashion indicated in FIG. 3 by means of ball bearings inside the housing 10. In this respect the ball bearings 48, which include the gear wheels 21 and 22 between them, are locked in place by means of spring washers on the shafts 23 and 24. On the lower side of the housing the drill spindles 26 are provided with coupling members 30, 31, 32 in order to receive and hold chuck drill bits. The shown drill spindle 26 extends from shaft 24.

Only one drill spindle 26 is shown in FIG. 2. In FIG. 3 a second drill spindle 26 is located behind the shown spindle 26, located on drive spindle shaft 23.

The shaft journals 15 and 16 projecting past the housing cover 11 are provided with flats 27, which correspond to the standard flats on the drill bits which are able to be inserted into the coupling members of the drill spindle 8 of the drilling machine so that the shaft journals 15 and 16 may be coupled with the drill spindles of the drilling machine instead of the drill bits 9.

Figure 4:
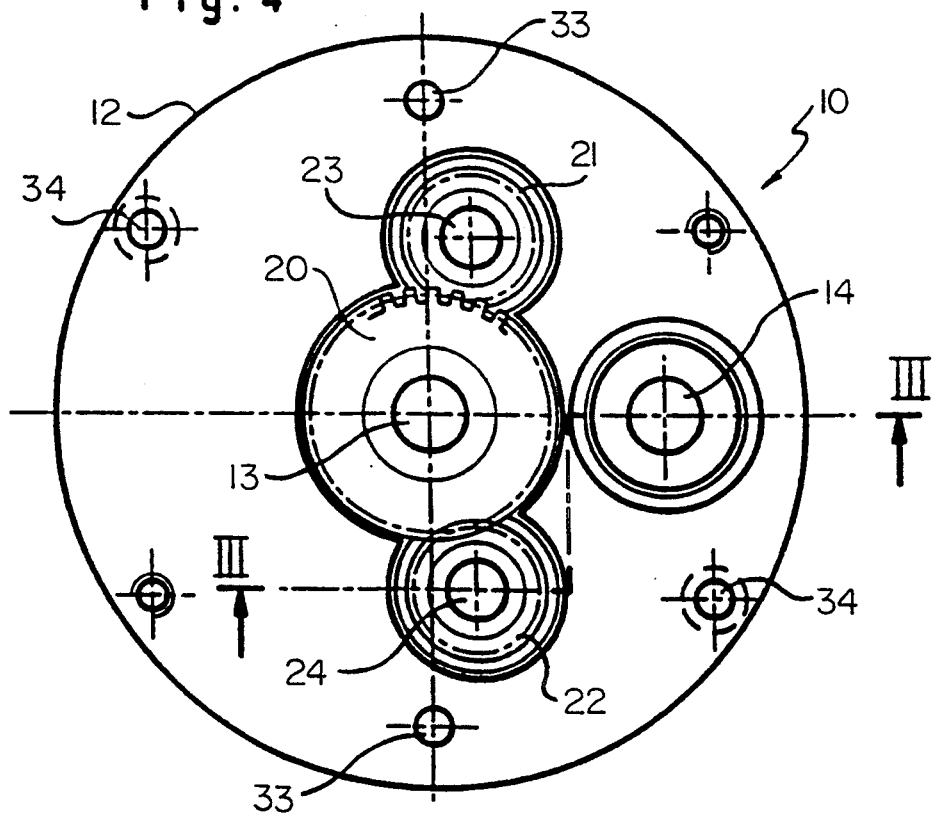
FIG. 4 is a plan view of the adapter housing in accordance with FIGS. 2 and 3 with the housing cover partly broken away.

As shown in FIGS. 3 and 4 the shaft journal 16 of the drill spindle shaft 14 is directly coupled with the coupling member of the drill spindle 18 without being drivingly connected with the shaft journal 15.

The coupling members of the drill spindles 17, 18 and 26 are provided with blind holes 30 in the fashion indicated in FIG. 2 and the drill bits can be inserted into such holes and secured by means of screws 31 run into radial screw threaded holes 32.

The housing 44 has a circularly round form and is furnished with locating or centering holes 33 and holes 34 for screwing cover screws (not illustrated).

If the adapter depicted in FIGS. 2 through 4 is coupled with the couplings of the drill spindles 8 of the drilling machine 1, it is possible to drill holes using the drill spindle arrangement of the adapter. The adapter is directly driven by the drilling machine so that it is immediately capable of functioning after insertion into the coupling members of the drill spindles 8. It is merely necessary to set the abutments of the feed device of the drilling machine to the distance changed by the adapter. It is therefore possible to drive three holes or all of the drill holes from single shaft journal 15 in the absence of a hole being drilled by drill spindle 18.

In the case of the illustrated embodiment of the drill spindle carrier 10 constituting the adapter it is for instance possible to insert two drill bits with a diameter of 10 mm in the drill spindles 26 and one drill bit or routing tool with a diameter of 35 mm in the central drill spindle 17 so that in one single working operation recesses may be sunk in a door for a hinge pot together with lateral drilled holes for plugs for the attachment of the hinge pot.

Furthermore there is the possibility of using only two drill bits with a diameter of 10 mm on the drill spindles 17 and 18 so that holes may be drilled in a wall of piece of furniture for the plugs of a base plate with a spacing of 32 mm.

In the case of the drilling of the holes for the hinge pot the drill spindle 18 is not used. The upper shaft journal 16 of the drill spindle 14 is however employed for the attachment, alignment and steadying of the drill spindle carrier 10.

In a similar fashion it is possible for the adapters to be designed for different patterns of drilled holes.

I claim:

1. An adapter for a drilling machine having at least one drill spindle, said adapter comprising:

a housing with two mutually parallel input shafts extending from one side, said housing having at least three drill spindles with attachment means for drill bits, said at least three drill spindles being arranged on a side of said housing opposite to said side from which said two mutually parallel input shafts extend, and transmission means for connecting together at least two of said at least three drill spindles of said housing with one of said two input shafts in a driving manner and for connecting together only one of said at least three drill spindles of said housing with the other of said two input shafts in a driving manner so that said two input shafts are driven independent of each other.

2. An adapter for a drilling machine having two drill spindles with attachment devices for drill bits, said adapter comprising:

a housing with two mutually parallel input shafts extending from one side, said housing having four drill spindles with attachment means for drill bits, said four drill spindles being arranged on a side of said housing opposite to said side from which said two mutually parallel input shafts extend and two of said four drill spindles being arranged at a distance apart equal to said distance apart of said two mutually parallel input shafts, and transmission means for connecting together a plurality of said drill spindles of said housing with one of said two input shafts in a driving manner.

3. An adapter for a drilling machine having two drill spindles with attachment devices for drill bits, said adapter comprising:

a housing with two mutually parallel input shafts extending from one side, said housing having drill spindles with attachment means for drill bits, said drill spindles being arranged on a side of said housing opposite to said side from which said two mutually parallel input shafts extend, transmission means for connecting together a plurality of said drill spindles of said housing with one of said two input shafts in a driving manner, at least one of said two mutually parallel input shafts including a pinion in mesh with two gear wheels of two shafts of two of said drill spindles of said housing, said two shafts of said two drill spindles being journaled in said housing.

4. The adapter as claimed in claim 3, wherein said two drill spindles of said housing are arranged symmetrically in relation to a plane through a center line of said two mutually parallel input shafts.

5. The adapter as claimed in claim 3, wherein said driving pinion has a larger diameter than said two gear wheels of said two shafts of said two drill spindles of said housing.

* * * * *